(12) United States Patent
Kobayashi et al.

(10) Patent No.: US 10,133,125 B2
(45) Date of Patent: Nov. 20, 2018

(54) LIQUID CRYSTAL DISPLAY DEVICE

(71) Applicant: Japan Display Inc., Minato-ku (JP)

(72) Inventors: Junichi Kobayashi, Nomi-gun (JP); Kazuyuki Harada, Nonoichi (JP)

(73) Assignee: JAPAN DISPLAY INC., Minato-ku (JP)

( * ) Notice: Subject to any disclaimer, the term of this patent is extended or adjusted under 35 U.S.C. 154(b) by 24 days.

(21) Appl. No.: 15/231,081

(22) Filed: Aug. 8, 2016

(65) Prior Publication Data

US 2016/0342004 A1 Nov. 24, 2016

Related U.S. Application Data

(63) Continuation of application No. 13/526,739, filed on Jun. 19, 2012, now Pat. No. 9,429,788.

(30) Foreign Application Priority Data

Jun. 27, 2011 (JP) .................................. 2011-141802

(51) Int. Cl.
*G02F 1/1335* (2006.01)
*G02F 1/1339* (2006.01)
(Continued)

(52) U.S. Cl.
CPC ........ *G02F 1/13394* (2013.01); *G02F 1/1337* (2013.01); *G02F 1/133512* (2013.01);
(Continued)

(58) Field of Classification Search
CPC ......... G02F 1/133512; G02F 1/133514; G02F 1/13394; G02F 1/134363
See application file for complete search history.

(56) References Cited

U.S. PATENT DOCUMENTS

| | | | |
|---|---|---|---|
| 2009/0009704 A1 | 1/2009 | Tomikawa | |
| 2009/0103025 A1* | 4/2009 | Tanno | G02F 1/134363 349/110 |
| 2009/0128727 A1 | 5/2009 | Yata | |
| 2009/0268145 A1 | 10/2009 | Anjo et al. | |
| 2010/0128210 A1 | 5/2010 | Mori et al. | |
| 2010/0309416 A1* | 12/2010 | Gotoh | G02F 1/133514 349/123 |
| 2011/0051060 A1* | 3/2011 | Sato | G02F 1/133512 349/110 |
| 2012/0257149 A1* | 10/2012 | Li | G02F 1/133514 349/106 |

FOREIGN PATENT DOCUMENTS

JP 11-218771 A 8/1999
JP 2000-330121 A 11/2000
(Continued)

OTHER PUBLICATIONS

Japanese Office Action dated Nov. 11, 2014 in Patent Application No. 2011-141802 (with English translation).

*Primary Examiner* — Jessica M Merlin
(74) *Attorney, Agent, or Firm* — Oblon, McClelland, Maier & Neustadt, L.L.P.

(57) ABSTRACT

According to one embodiment, a liquid crystal display device includes a first substrate including a common electrode, an insulation film, and a pixel electrode, and a second substrate including a black matrix which includes a first light-shield portion, a second light-shield portion and a third light-shield portion, a first crossing portion at which the first light-shield portion and the second light-shield intersect, a second crossing portion at which the first light-shield portion and the third light-shield portion intersect, and a columnar spacer extending from a position overlapping the first crossing portion toward the first substrate.

10 Claims, 11 Drawing Sheets

(51) Int. Cl.
  *G02F 1/1337*  (2006.01)
  *G02F 1/1343*  (2006.01)
  *H01L 27/12*  (2006.01)
  *G02F 1/133*  (2006.01)
  *G02F 1/1333*  (2006.01)
  *G02F 1/1368*  (2006.01)

(52) U.S. Cl.
  CPC .. *G02F 1/133514* (2013.01); *G02F 1/134309* (2013.01); *H01L 27/124* (2013.01); *G02F 1/1368* (2013.01); *G02F 1/13306* (2013.01); *G02F 1/13439* (2013.01); *G02F 1/133345* (2013.01); *G02F 1/134363* (2013.01); *G02F 2001/133302* (2013.01); *G02F 2001/134372* (2013.01); *G02F 2201/121* (2013.01); *G02F 2201/123* (2013.01)

(56) References Cited

FOREIGN PATENT DOCUMENTS

| | | |
|---|---|---|
| JP | 2004-252309 A | 9/2004 |
| JP | 2008-58573 A | 3/2008 |
| JP | 2008-268778 A | 11/2008 |
| JP | 2009-210967 A | 9/2009 |
| JP | 2009210967 A | 9/2009 |
| JP | 2010-72067 | 4/2010 |
| JP | 2010-224090 A | 10/2010 |
| JP | 2011-48170 A | 3/2011 |
| JP | 2011-95475 A | 5/2011 |

\* cited by examiner

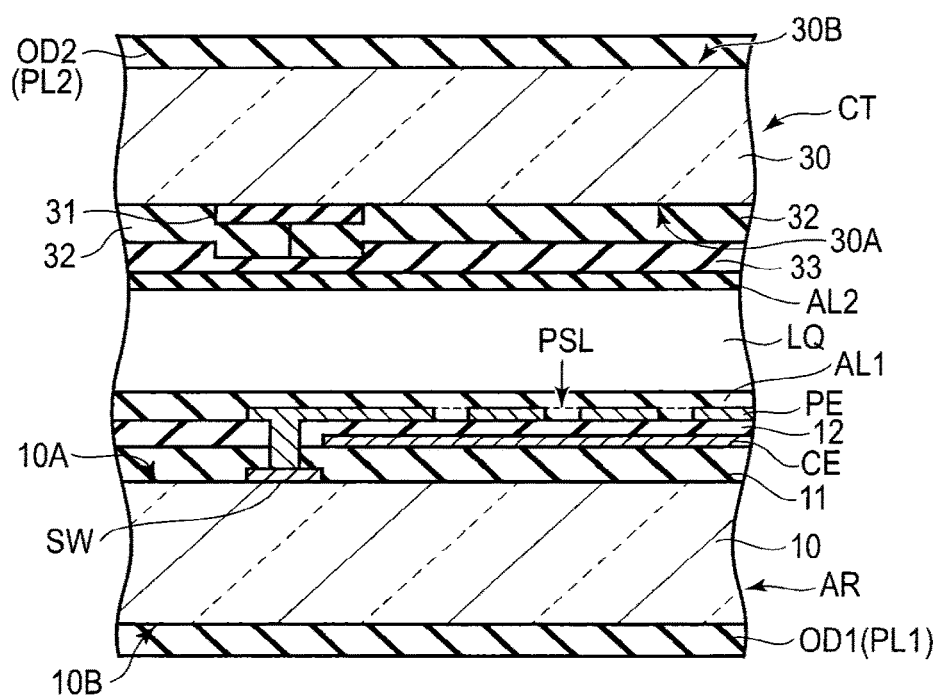
F I G. 2

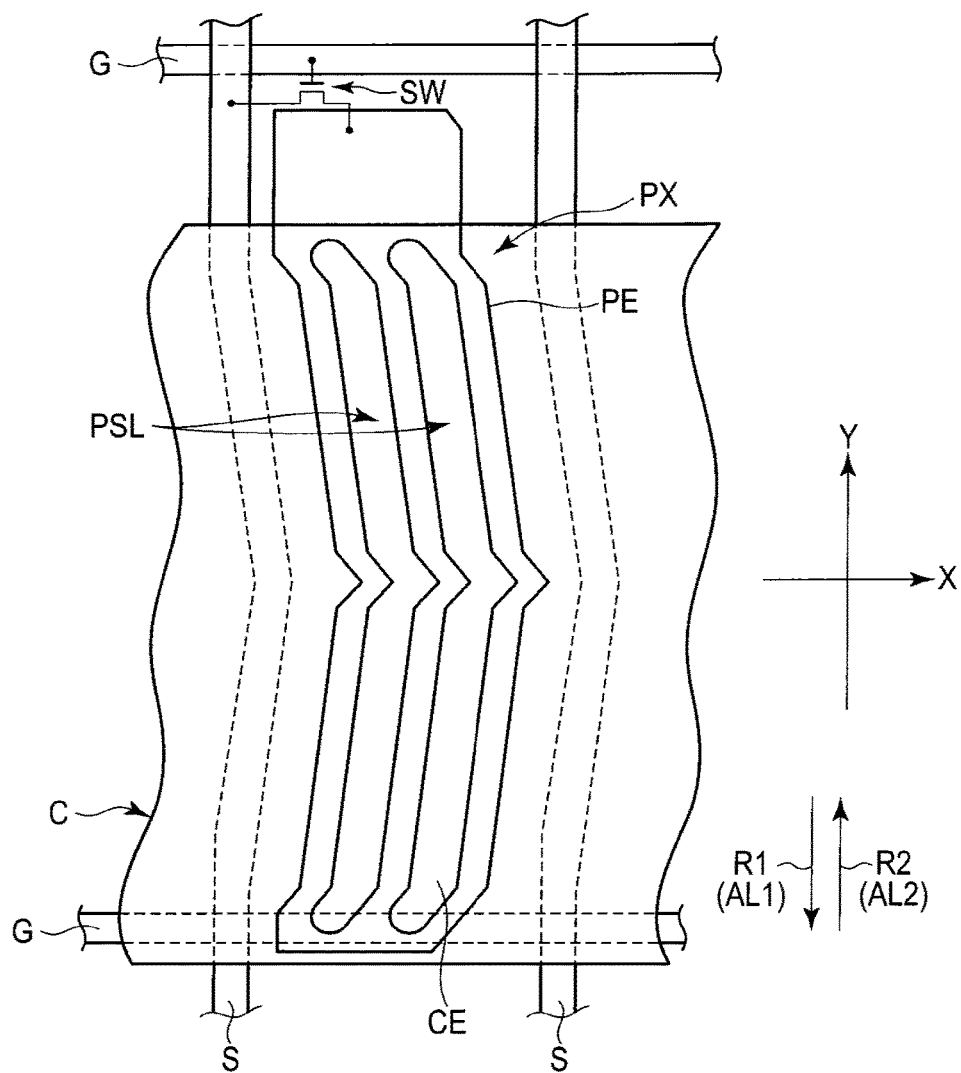
F I G. 4

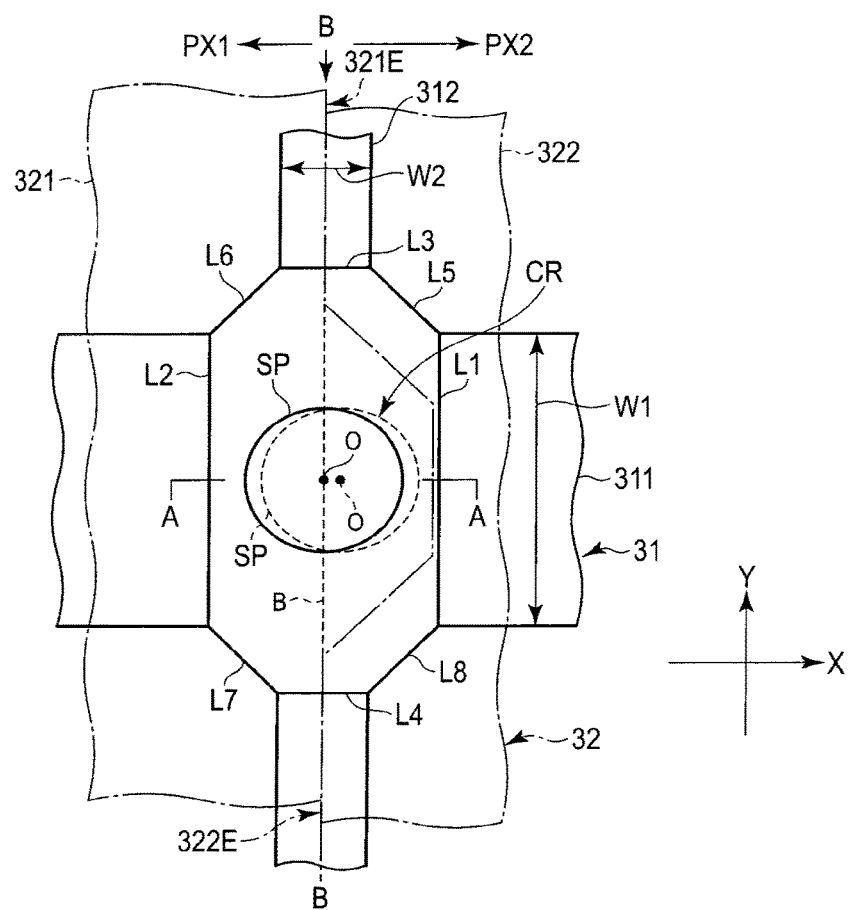
F I G. 5

LIQUID CRYSTAL DISPLAY DEVICE

CROSS-REFERENCE TO RELATED APPLICATIONS

This application is a continuation of and is based upon and claims the benefit of priority under 35 U.S.C. § 120 for U.S. Ser. No. 13/526,739, filed Jun. 19, 2012 and claims the benefit of priority under 35 U.S.C. § 119 from Japanese Patent Application No. 2011-141802, filed Jun. 27, 2011, the entire contents of which are incorporated herein by reference.

FIELD

Embodiments described herein relate generally to a liquid crystal display device.

BACKGROUND

By virtue of such advantageous features as light weight, small thickness and low power consumption, liquid crystal display devices have been used in various fields as display devices of OA equipment, such as personal computers, and TVs. In recent years, liquid crystal display devices have also been used as display devices of portable terminal equipment such as mobile phones, car navigation apparatuses, game machines, etc.

In recent years, liquid crystal display panels of a fringe field switching (FFS) mode and in-plane switching (IPS) mode have been put to practical use. The liquid crystal display panel of the FFS mode or IPS mode is configured such that a liquid crystal layer is held between an array substrate, which includes a pixel electrode and a common electrode, and a counter-substrate. A spacer for creating a cell gap is disposed between the array substrate and the counter-substrate. There is a demand for improving the occurrence of display non-uniformity due to the spacer.

BRIEF DESCRIPTION OF THE DRAWINGS

FIG. 2 is a cross-sectional view which schematically shows a cross-sectional structure of the liquid crystal display panel shown in FIG. 1.

FIG. 4 is a schematic plan view which illustrates another structure of the pixel in the array substrate shown in FIG. 2, as viewed from the counter-substrate side.

FIG. 5 is a schematic plan view for explaining a positional relationship between a black matrix, a color filter and a columnar spacer in a counter-substrate, which is applicable to the liquid crystal display panel having the pixel structure shown in FIG. 3.

DETAILED DESCRIPTION

Figure 1:
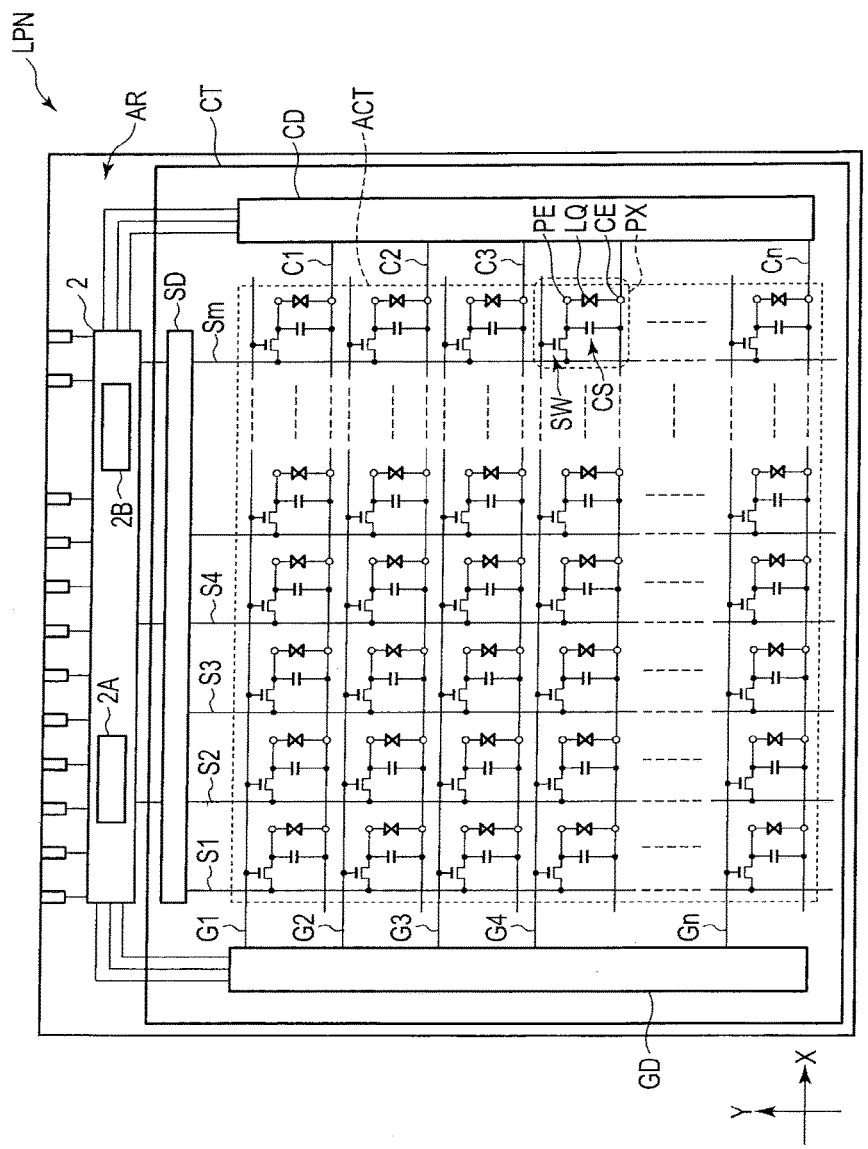
FIG. 1 is a view which schematically illustrates a structure and an equivalent circuit of a liquid crystal display panel which constitutes a liquid crystal display device according to an embodiment.

In general, according to one embodiment, a liquid crystal display device includes a first substrate including a common electrode formed over a plurality of pixels, an insulation film covering the common electrode, a pixel electrode which is formed in each of the pixels on the insulation film and is opposed to the common electrode and in which a slit is formed, and a first alignment film which covers the pixel electrode and is subjected to alignment treatment in a direction crossing the slit at an angle of 5° to 10°; a second substrate including a black matrix which includes a first light-shield portion extending in a first direction, a second light-shield portion and a third light-shield portion which extend in a second direction crossing the first direction, a first crossing portion at which the first light-shield portion and the second light-shield intersect, and a second crossing portion at which the first light-shield portion and the third light-shield portion intersect and which has a smaller area than the first crossing portion, the second substrate further including a columnar spacer extending from a position overlapping the first crossing portion toward the first substrate, and a second alignment film which covers a surface on a side facing the first substrate and is subjected to alignment treatment in a direction which is parallel to and opposite to the direction of the alignment treatment of the first alignment film; and a liquid crystal layer held between the first substrate and the second substrate.

According to another embodiment, a liquid crystal display device includes a first substrate including a common electrode formed over a plurality of pixels, an insulation film covering the common electrode, and a pixel electrode which is formed in each of the pixels on the insulation film and is opposed to the common electrode and in which a slit is formed; a second substrate including a first light-shield portion extending in a first direction with a first width, a second light-shield portion extending in a second direction crossing the first direction with a second width which is less than the first width, an intermediate light-shield portion which connects the first light-shield portion and the second light-shield portion and extends in a gradually widening fashion from a terminal end portion of the first light-shield portion toward an edge of the second light-shield portion, a first color filter which is disposed on one side of the second light-shield portion and extends on the intermediate light-shield portion beyond the second light-shield portion, a second color filter disposed on the other side of the second light-shield portion, an overcoat layer covering the first color filter and the second color filter, and a columnar spacer extending toward the first substrate from a position overlapping the first color filter extending on the intermediate light-shield portion; and a liquid crystal layer held between the first substrate and the second substrate.

According to another embodiment, a liquid crystal display device includes a first substrate including a gate line extending in a first direction, a source line extending in a second direction crossing the first direction, a switching element electrically connected to the gate line and the source line, an interlayer insulation film covering the switching element, a common electrode formed over a plurality of pixels on the interlayer insulation film, an insulation film covering the common electrode, and a pixel electrode which is formed in each of the pixels on the insulation film, is electrically connected to the switching element via a contact hole penetrating the interlayer insulation film and the insulation film and is opposed to the common electrode, a slit being formed in the pixel electrode; a second substrate including a black matrix including a first light-shield portion which extends in the first direction and is opposed to the gate line and the switching element, and a second light-shield portion which extends in the second direction and is opposed to the source line, the black matrix having an oblique side, which extends in a direction different from the first direction and the second direction, at a first crossing portion between the first light-shield portion and the second light-shield portion, the second substrate further including a columnar spacer extending toward the first substrate from a position overlapping the first crossing portion; and a liquid crystal layer held between the first substrate and the second substrate.

Embodiments will now be described in detail with reference to the accompanying drawings. In the drawings, structural elements having the same or similar functions are denoted by like reference numerals, and an overlapping description is omitted.

FIG. 1 is a view which schematically shows a structure and an equivalent circuit of a liquid crystal display panel LPN which constitutes a liquid crystal display device according to an embodiment.

Specifically, the liquid crystal display device includes an active-matrix-type liquid crystal display panel LPN. The liquid crystal display panel LPN is configured to include an array substrate (first substrate) AR, a counter-substrate (second substrate) CT which is disposed to be opposed to the array substrate AR, and a liquid crystal layer LQ which is held between the array substrate AR and the counter-substrate CT. The liquid crystal display panel LPN includes an active area ACT which displays an image. The active area ACT is composed of a plurality of pixels PX which are arrayed in a matrix of m×n (m and n are positive integers).

The array substrate AR includes, in the active area ACT, an n-number of gate lines G (G1 to Gn) and an n-number of capacitance lines C (C1 to Cn), which extend in a first direction X, an m-number of source lines S (S1 to Sm) which extend in a second direction Y crossing the first direction, an (m×n) number of switching elements SW, each of which is electrically connected to the gate line G and source line S in each pixel PX, an (m×n) number of pixel electrodes PE, each of which is electrically connected to the switching element SW in each pixel PX, and a common electrode CE which is a part of the capacitance line C and is opposed to the pixel electrode PE. A storage capacitance CS is formed between the capacitance line C and pixel electrode PE.

The common electrode CE is commonly formed over a plurality of pixels PX. The pixel electrode PE is formed in an island shape in each pixel PX.

Each of the gate lines G is led out to the outside of the active area ACT and is connected to a first driving circuit GD. Each of the source lines S is led out to the outside of the active area ACT and is connected to a second driving circuit SD. Each of the capacitance lines C is led out to the outside of the active area ACT and is connected to a third driving circuit CD. The first driving circuit GD, second driving circuit SD and third driving circuit CD are formed on the array substrate AR and are connected to a driving IC chip 2. In the example illustrated, the driving IC chip 2 is mounted on the array substrate AR, on the outside of the active area ACT of the liquid crystal display panel LPN, as a signal source which is necessary for driving the liquid crystal display panel LPN.

In the embodiment, the driving IC chip 2 includes an image signal write circuit 2A which executes control necessary for writing an image signal in the pixel electrode PE of each pixel PX in an image display mode for displaying an image in the active area ACT. In the meantime, the driving IC chip 2 may also include, in addition to the image signal write circuit 2A, a detection circuit 2B which detects a variation of an electrostatic capacitance of a touch-sensing wiring (e.g. an electrostatic capacitance between the capacitance line C and source line S as the touch-sensing wiring) in a touch-sensing mode for detecting a contact of an object on a detection surface.

In addition, the liquid crystal display panel LPN of the illustrated example is configured to be applicable to an FFS mode or an IPS mode, and includes the pixel electrode PE and common electrode CE on the array substrate AR. In the liquid crystal display panel LPN with this structure, liquid crystal molecules, which constitute the liquid crystal layer LQ, are switched by mainly using a lateral electric field which is produced between the pixel electrode PE and common electrode CE (e.g. that part of a fringe electric field, which is substantially parallel to a major surface of the substrate).

FIG. 2 is a view which schematically shows a cross-sectional structure of the liquid crystal display panel LPN shown in FIG. 1.

Specifically, the array substrate AR is formed by using a first insulative substrate 10 with light transmissivity, such as a glass substrate. The array substrate AR includes the switching element SW, common electrode CE and pixel electrode PE on an inner surface of the first insulative substrate 10 (i.e. that surface of the first insulative substrate 10, which is opposed to the counter-substrate CT).

The switching element SW illustrated in this example is a thin-film transistor (TFT). The switching element SW includes a polysilicon semiconductor layer or an amorphous silicon semiconductor layer. The switching element SW is covered with a first insulation film 11.

The common electrode CE is formed on the first insulation film 11. The common electrode CE is covered with a second insulation film 12. The second insulation film 12 is also disposed on the first insulation film 11. The pixel electrode PE is formed on the second insulation film 12. The pixel electrode PE is connected to the switching element SW via a contact hole which penetrates the first insulation film 11 and second insulation film 12. In addition, the pixel electrode PE includes slits PSL which are opposed to the common electrode CE via the insulation film 12. The common electrode CE and pixel electrodes PE are formed of a transparent, electrically conductive material such as indium tin oxide (ITO) or indium zinc oxide (IZO). The pixel electrode PE is covered with a first alignment film AL1. The first alignment film AL1 is disposed on that surface of the array substrate AR, which is in contact with the liquid crystal layer LQ.

On the other hand, the counter-substrate CT is formed by using a second insulative substrate 30 with light transmissivity, such as a glass substrate. The counter-substrate CT includes a black matrix 31 which partitions pixels PX, a color filter 32, an overcoat layer 33 and a columnar spacer (not shown) on that side of the second insulative substrate 30, which is opposed to the array substrate AR).

The black matrix 31 is formed on an inner surface 30A of the second insulative substrate 30 so as to be opposed to wiring portions, such as gate lines G, source lines G and switching elements SW, which are provided on the array substrate AR.

The color filter 32 is formed on the inner surface 30A of the second insulative substrate 30, and also extends over the black matrix 31. The color filter 32 is formed of resin materials which are colored in mutually different colors, e.g. three primary colors of red, blue and green. A red color filter, which is formed of a resin material colored in red, is disposed in association with a red pixel. A blue color filter, which is formed of a resin material colored in blue, is disposed in association with a blue pixel. A green color filter, which is formed of a resin material colored in green, is disposed in association with a green pixel.

In the present embodiment, color filters 32 of the same color extend in the second direction Y shown in FIG. 1, and color filters 32 of different colors are alternately arranged in the first direction X (for example, color filters 32 are arranged in the order of a red color filter, a green color filter, a blue color filter, a red color filter, . . . ). In short, the color filters 32 of mutually different colors are arranged in pixels neighboring in the first direction X. The color filters 32 of mutually different colors are abutted on each other so as not to overlap each other on the black matrix 31. Boundaries between the color filters of different colors are located on the black matrix 31.

The overcoat layer 33 covers the color filters 32. The overcoat layer 33 planarizes asperities on the surface of the black matrix 31 and color filter 32. That surface of the overcoat layer 33, which is opposed to the array substrate AR, is covered with a second alignment film AL2. The second alignment film AL2 is disposed on that surface of the counter-substrate CT, which is in contact with the liquid crystal layer LQ.

The above-described array substrate AR and counter-substrate CT are disposed such that their first alignment film AL1 and second alignment film AL2 are opposed to each other. In this case, the columnar spacer, which is formed on the counter-substrate CT, creates a predetermined cell gap between the array substrate AR and the counter-substrate CT. The array substrate AR and counter-substrate CT are attached by a sealant in the state in which the predetermined cell gap is created therebetween. The liquid crystal layer LQ is composed of a liquid crystal composition including liquid crystal molecules which are sealed in the cell gap created between the first alignment film AL1 of the array substrate AR and the second alignment film AL2 of the counter-substrate CT.

A backlight (not shown) is disposed on the back side of the liquid crystal display panel LPN having the above-described structure. A first optical element OD1 including a first polarizer PL1 is disposed on an outer surface of the array substrate AR, that is, an outer surface 10B of the first insulative substrate 10. In addition, a second optical element OD2 including a second polarizer PL2 is disposed on an outer surface of the counter-substrate CT, that is, an outer surface 30B of the second insulative substrate 30. A first absorption axis (or a first polarization axis) of the first polarizer PL1 and a second absorption axis (or a second polarization axis) of the second polarizer PL2 are disposed, for example, in a positional relationship of crossed Nicols.

The first alignment film AL1 and second alignment film AL2 are subjected to alignment treatment in mutually parallel directions in a plane which is parallel to substrate major surfaces. Specifically, the alignment treatment direction of the first alignment film AL1 and the alignment treatment direction of the second alignment film AL2 are parallel to each other and are opposite to each other. Accordingly, in the state in which no electric field is produced between the pixel electrode PE and common electrode CE, the liquid crystal molecules included in the liquid crystal layer LQ are initially aligned in the alignment treatment directions of the first alignment film AL1 and second alignment film AL2 in the plane (the direction in which liquid crystal molecules are initially aligned is also referred to as "initial alignment direction"). In the state in which a fringe electric field is produced between the pixel electrode PE and common electrode CE, the liquid crystal molecules are aligned in a direction different from the initial alignment direction in the X-Y plane.

Figure 3:
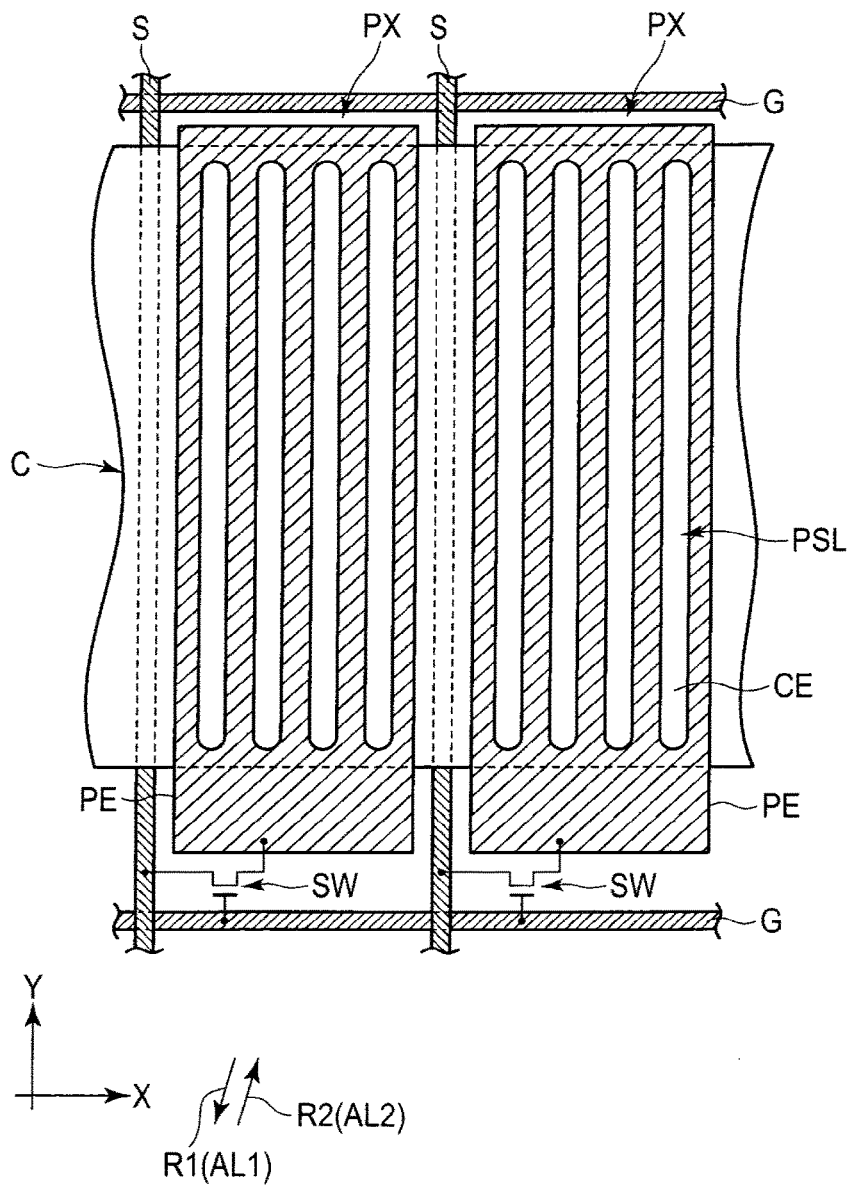
FIG. 3 is a schematic plan view which illustrates a structure of a pixel in an array substrate shown in FIG. 2, as viewed from a counter-substrate side.

FIG. 3 is a schematic plan view which illustrates the structure of the pixel PX in the array substrate AR shown in FIG. 2, as viewed from the counter-substrate CT side. FIG. 3 shows only main parts which are necessary for the description.

The gate lines G extend in a first direction X. The source lines S extend in a second direction Y which crosses the first direction X. The switching element SW is disposed at an intersection portion between the gate line G and the source line S, but the depiction of the switching element SW is omitted.

The capacitance line C extends in the first direction X. Specifically, the capacitance line C is disposed in each pixel PX and extends above the source lines S, and is commonly formed over a plurality of pixels PX which neighbor in the first direction X. The capacitance line C includes the common electrode CE which is formed in association with each pixel PX.

The pixel electrode PE of each pixel PX is disposed above the common electrode CE. Each pixel electrode PE is formed in each pixel PX in an island shape corresponding to the pixel shape. In the example illustrated, the pixel electrode PE is formed in a substantially rectangular shape having short sides along the first direction X and long sides along the second direction Y. A plurality of slits PSL, which is opposed to the common electrode CE, is formed in each pixel electrode PE. In the example illustrated, each of the slits PSL extends in the second direction Y.

The first alignment film AL1 is subjected to alignment treatment in a direction crossing the slit PSL at an acute angle of 45° or less. An alignment treatment direction R1 of the first alignment film AL1 is, for example, a direction crossing the second direction Y of extension of the slit PSL at an angle of 5° to 10°. In addition, the second alignment film AL2 is subjected to alignment treatment in a direction which is parallel to the alignment treatment direction R1 of the first alignment film AL1. The alignment treatment direction R1 of the first alignment film AL1 and an alignment treatment direction R2 of the second alignment film AL2 are opposite to each other.

FIG. 4 is a schematic plan view which illustrates another structure of the pixel PX in the array substrate AR shown in FIG. 2, as viewed from the counter-substrate CT side. FIG. 4 shows only main parts which are necessary for the description.

Gate lines G extend in the first direction X. Source lines S shown in FIG. 4 extend substantially in the second direction Y, and include intermediate portions which are bent in a V shape between neighboring gate lines G. A switching element is disposed at an intersection portion between the gate line G and source line S, but the depiction of the switching element is omitted.

Like the example shown in FIG. 3, a capacitance line C extends in the first direction X, and is commonly formed over a plurality of pixels PX which neighbor in the first direction X. The capacitance line C includes the common electrode CE which is formed in association with each pixel PX.

A pixel electrode PE of each pixel PX is disposed above the common electrode CE. Each pixel electrode PE is formed in each pixel PX in an island shape corresponding to the pixel shape. In the example illustrated, like the intermediate portion of the source line S, the pixel electrode PE is formed in a V-shaped bent shape. A plurality of slits PSL, which is opposed to the common electrode CE, is formed in each pixel electrode PE. In the example illustrated, each slit PSL is bent in a V shape, like the intermediate portion of the source line S.

The first alignment film AL1 and second alignment film AL2 are subjected to alignment treatment in directions crossing the slit PSL. The alignment treatment direction R1 of the first alignment film AL1 and the alignment treatment direction R2 of the second alignment film AL2 are substantially parallel to the second direction Y and are opposite to each other. The angle between the alignment treatment direction R1, R2 and the slit PSL is about 5° to 10°.

The intermediate portion of the source line S, the pixel electrode PE and the slit PSL may have shapes which are formed by inverting the shapes in the illustrated example in the right-and-left direction.

FIG. 5 is a schematic plan view for explaining a positional relationship between the black matrix 31, the color filter 32 and a columnar spacer SP in the counter-substrate CT, which is applicable to the liquid crystal display panel LPN having the pixel structure shown in FIG. 3.

The black matrix 31 includes a first light-shield portion 311 extending in the first direction X, and a second light-shield portion 312 extending in the second direction Y. The first light-shield portion 311 is mainly opposed to the gate line and switching element shown in FIG. 3, which extend in the first direction X. The first light-shield portion 311 has a first width W1 in the second direction Y. The second light-shield portion 312 is mainly opposed to the source line shown in FIG. 3, which extends in the second direction Y. The second light-shield portion 312 has a second width W2 in the first direction X. The first light-shield portion 311 is greater in width than the second light-shield portion 312, and the first width W1 is greater than the second width W2.

In the example illustrated, the first light-shield portion 311 and second light-shield portion 312 form a crossing portion CR of a substantially octagonal shape. Specifically, the first light-shield portion 311 and second light-shield portion 312 extend, with substantially uniform respective widths, in directions perpendicular to each other, but have gradually increasing widths in the vicinity of the crossing portion CR.

Incidentally, the first light-shield portion 311 and second light-shield portion 312 are formed integral or continuous in the same plane. Thus, the outer shape of the crossing portion CR is not visually viewed as the octagonal shape as shown in FIG. 5. The outer shape of the crossing portion CR is defined by terminal end portions (i.e. sides extending in the second direction Y with the first width W1) L1 and L2 at which the first light-shield portion 311 keeps the first width W1, terminal end portions (i.e. sides extending in the first direction X with the second width W2) L3 and L4 at which the second light-shield portion 312 keeps the second width W2, and oblique sides L5 to L8 which connect these terminal end portions. The oblique sides L5 to L8 extend in directions different from the first direction X and second direction Y. Specifically, the crossing portion CR between the first light-shield portion 311 and second light-shield portions 312 includes oblique sides extending in directions different from the first direction X and second direction Y. In the meantime, the respective terminal end portions may be connected with straight lines or curved lines. The curved lines in the case are recessed toward the inside of the crossing portion CR.

The color filter 32 includes a first color filter 321 which is disposed on the left side in FIG. 5 and a second color filter 322 which is disposed on the right side in FIG. 5. The first color filter 321 extends over the first light-shield portion 311, and is disposed in the first color pixels PX1 which neighbor in the second direction Y, with the first light-shield portion 311 interposed. The second color filter 322 is a color filter of a color different from the color of the first color filter 321, extends over the first light-shield portion 311, and is disposed in the second color pixels PX2 which neighbor in the second direction Y, with the first light-shield portion 311 interposed. An edge 321E of the first color filter 321 and an edge 322E of the second color filter 322 are located on the second light-shield portion 312 and the crossing portion CR. Specifically, the second light-shield portion 312 is disposed between the first color pixel PX1 and second color pixel PX2. In the example illustrated, the first color filter 321 and second color filter 322 are abutted upon each other, and there is no gap between the edge 321E and edge 322E.

In this case, if a pixel boundary B between the first color pixel PX1 and second color pixel PX2 is linearly provided on the second light-shield portion 312, the edge 321E of the first color filter 321 extends along the pixel boundary B on the second light-shield portion 312, and extends to the second color pixel PX2 side from the pixel boundary B (i.e. toward the side L1 of the crossing portion CR) in the crossing portion CR. Thus, the most part of the color filter, which overlaps the crossing portion CR, is the first color filter 321.

The columnar spacer SP is disposed at a position overlapping the crossing portion CR. The underlayer of the columnar spacer SP is a single color filter, and is the first color filter 321 in the example illustrated. Specifically, the columnar spacer SP overlaps none of the edges of the color filters.

In the example illustrated, the center O of the columnar spacer SP is located on the pixel boundary B, but the center O may be offset toward the first color pixel PX1 or the second color pixel PX2. In an example indicated by a broken line in FIG. 5, the center O of the columnar spacer SP is offset to the second color pixel PX2 side of the pixel boundary B. If a part of the columnar spacer SP is located on the pixel boundary B, an offset to the first color pixel PX1 side or to the second color pixel PX2 side is allowable. Specifically, an offset amount from the pixel boundary B to the center O of the columnar spacer SP is allowable within such a range that a part of the columnar spacer SP is located on the pixel boundary B. For example, the offset amount from the pixel boundary B to the center O of the columnar spacer SP is allowable within a range of 1 μm to 5 μm.

When columnar spacers SP are offset, columnar spacers SP which are located on the same straight line may be offset from the pixel boundary B in a staggering fashion (i.e. one columnar spacer SP is offset on the first color pixel PX1 side, and another neighboring columnar spacer SP is offset on the second color pixel PX2 side). In this case, even if misalignment in attachment occurs between the array substrate AR and the counter-substrate CT, any one of the columnar spacers SP exactly abuts on the array substrate AR, and a variance in cell gap can be reduced.

In addition, in the example illustrated, the columnar spacer SP has a circular outer shape in the X-Y plane, but it may have a polygonal shape or an elliptic shape.

The first color filter 321 and second color filter 322 are ones selected from a red color filter, a green color filter and a blue color filter, and the first color pixel PX1 and second color pixel PX2 are ones selected from a red pixel, a green pixel and a blue pixel. For example, the first color filer 321 is a red color filter and the second color filter 322 is a blue color filter, and the first color pixel PX1 is a red pixel and the second color pixel PX2 is a blue pixel.

Figure 6:
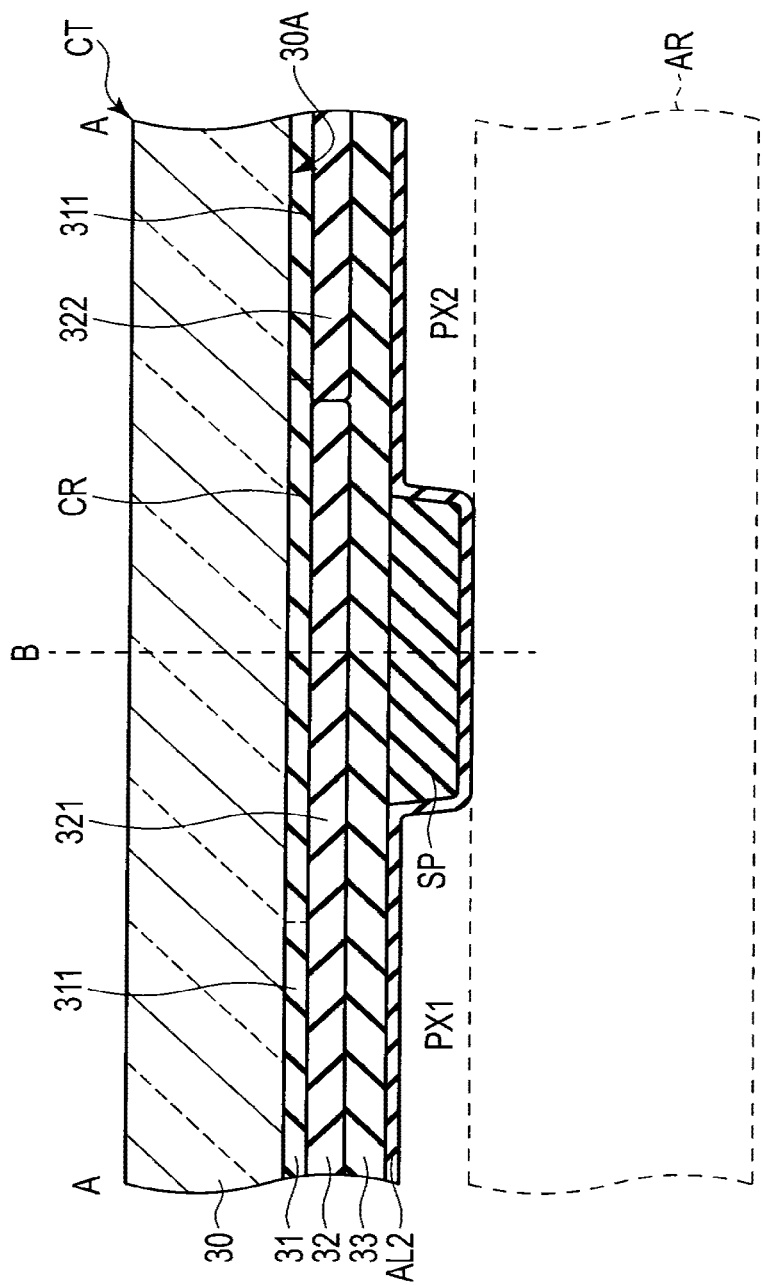
FIG. 6 is a view which schematically shows a cross section of the counter-substrate, taken along line A-A in FIG. 5.

FIG. 6 is a view which schematically shows a cross section of the counter-substrate CT, taken along line A-A in FIG. 5.

In the cross section along line A-A, the first light-shield portion 311 and crossing portion CR of the black matrix 31 are formed on the inner surface 30A of the second insulative substrate 30. The first color filter 321 of the color filter 32 extends from a position overlapping the first light-shield portion 311, which is located in the first color pixel PX1 on the left side in FIG. 6, to a position overlapping the crossing portion CR, and also extends from the pixel boundary B to the second color pixel PX2 side on the right side in FIG. 6. The second color filter 322 extends from a position overlapping the first light-shield portion 311, which is located in the second color pixel PX2 on the right side in FIG. 6, to a position overlapping the crossing portion CR, but terminates in front of the pixel boundary B, without extending beyond the pixel boundary B. The overcoat layer 33 covers the first color filter 321 and second color filter 322.

The columnar spacer SP extends from a position overlapping the crossing portion CR toward the array substrate AR. The columnar spacer SP is formed on the overcoat layer 33. A single color filter, namely the first color filter 321 in this example, extends between the columnar spacer SP and the crossing portion CR of the black matrix 31. In addition, the overcoat layer 33 extends between the first color filter 321 and the columnar spacer SP. The columnar spacer SP and the overcoat layer 33 are covered with the second alignment film AL2.

The content of the description with reference to FIG. 5 and FIG. 6 is one aspect of the embodiment. Next, another aspect of the embodiment is described. The same structural parts as in the example described with reference to FIG. 5 are denoted by like reference numerals, and a detailed description is omitted.

Figure 7:
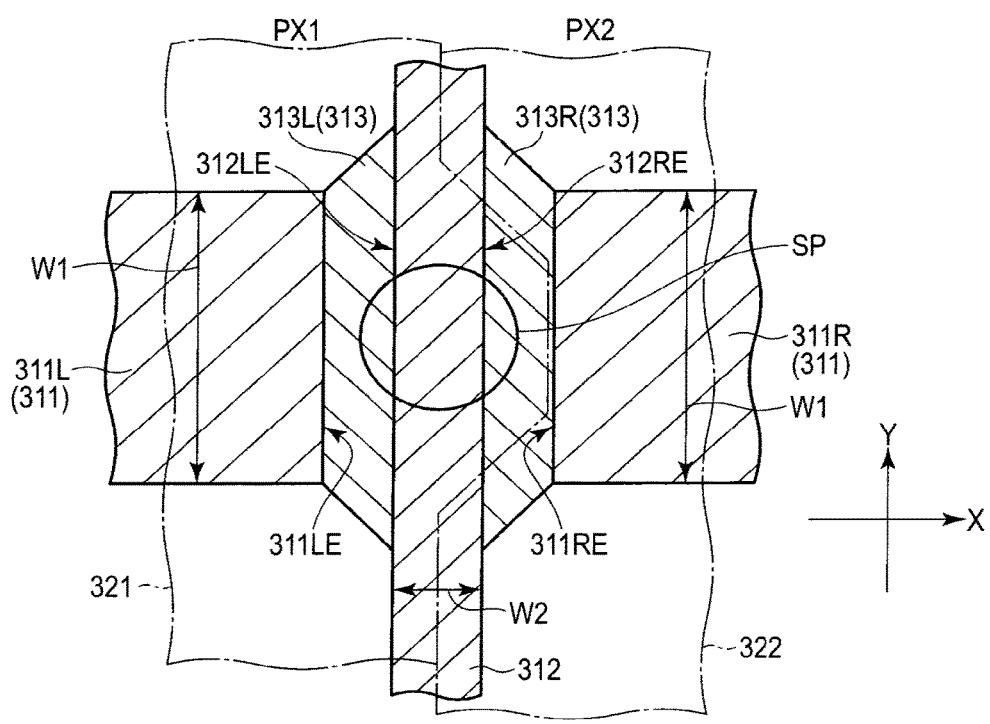
FIG. 7 is a schematic plan view for explaining a positional relationship between a black matrix, a color filter and a columnar spacer in a counter-substrate, which is applicable to the liquid crystal display panel having the pixel structure shown in FIG. 3.

FIG. 7 is a schematic plan view for explaining a positional relationship between the black matrix 31, the color filter 32 and the columnar spacer SP in the counter-substrate CT, which is applicable to the liquid crystal display panel LPN having the pixel structure shown in FIG. 3.

The black matrix 31 includes a first light-shield portion 311 extending in the first direction X and having a first width W1, and a second light-shield portion 312 extending in the second direction Y and having a second width W2. Like the above-described example, the first width W1 is greater than the second width W2.

The first light-shield portion 311 linearly extends in the first direction X with the first width 1 which is substantially uniform, and the first light-shield portion 311 is disposed on both sides of the second light-shield portion 312. In the example illustrated, the first light-shield portion 311, which is located on the left side in FIG. 7, is designated by "311L", and the first light-shield portion 311, which is located on the right side in FIG. 7, is designated by "311R". The first light-shield portion 311L includes a terminal end portion 311LE which is opposed to the second light-shield portion 312. The first light-shield portion 311R includes a terminal end portion 311RE which is opposed to the second light-shield portion 312.

The second light-shield portion 312 extends between the first light-shield portion 311L and the first light-shield portion 311R, and linearly extends along the second direction Y with the second width W2 which is substantially uniform. The second light-shield portion 312 includes an edge 312LE which is opposed to the terminal end portion 311LE of the first light-shield portion 311L, and an edge 312RE which is opposed to the terminal end portion 311RE of the first light-shield portion 311R.

The black matrix 31 further includes an intermediate light-shield portion 313 which connects the first light-shield portion 311 and second light-shield portion 312, and extends in a gradually widening fashion from the terminal end portion of the first light-shield portion 311 toward the edge of the second light-shield portion 312. In the example illustrated, the intermediate light-shield portion 313 is disposed on both sides of the second light-shield portion 312. In order to distinguish left and right intermediate light-shield portions 313, the intermediate light-shield portion 313 on the left side in FIG. 7 is designated by "313L", and the intermediate light-shield portion 313 on the right side in FIG. 7 is designated by "313R".

The intermediate light-shield portion 313L connects the first light-shield portion 311L and second light-shield portion 312, and extends in a gradually widening fashion from the terminal end portion 311LE of the first light-shield portion 311L toward the edge 312LE of the second light-shield portion 312. Specifically, the width of the intermediate light-shield portion 313L in the vicinity of the terminal end portion 311LE is equal to the first width W1, but the width in the second direction Y (up-and-down direction in FIG. 7) of the intermediate light-shield portion 313L in the vicinity of the edge 312LE is increased to become greater than the first width W1. In short, the intermediate light-shield portion 313L has a trapezoidal shape having as an upper base a side which is continuous with the terminal end portion 311LE, and having as a lower base a side which is continuous with the edge 312LE, with the upper base and lower base being parallel, and the upper base being shorter than the lower base.

The intermediate light-shield portion 313R connects the first light-shield portion 311R and second light-shield portion 312, and extends in a gradually widening fashion from the terminal end portion 311RE of the first light-shield portion 311R toward the edge 312RE of the second light-shield portion 312. Specifically, the width of the intermediate light-shield portion 313R in the vicinity of the terminal end portion 311RE is equal to the first width W1, but the width in the second direction Y (up-and-down direction in FIG. 7) of the intermediate light-shield portion 313R in the vicinity of the edge 312RE is increased to become greater than the first width W1. In short, the intermediate light-shield portion 313R has a trapezoidal shape having as an upper base a side which is continuous with the terminal end portion 311RE, and having as a lower base a side which is continuous with the edge 312RE, with the upper base and lower base being parallel, and the upper base being shorter than the lower base.

Incidentally, the first light-shield portion 311, second light-shield portion 312 and intermediate light-shield portion 313 are formed integral or continuous in the same plane. Thus, the intermediate light-shield portion 313 having the trapezoidal shape as shown in FIG. 7 is not visually viewed.

In the example illustrated, the intermediate light-shield portion 313 is disposed on both sides of the second light-shield portion 312. However, the intermediate light-shield portion 313 may be disposed on only one side of the second light-shield portion 312. For example, while the intermediate light-shield portion 313R is disposed, the terminal end portion 311LE of the first light-shield portion 311L may be continuous with the edge 312LE of the second light-shield portion 312.

The color filter 32 includes a first color filter 321 and a second color filter 322. The first color filter 321 is disposed on one of both sides of the second light-shield portion 312, that is, in the first color pixel PX1 on the left side in FIG. 7, and covers the first light-shield portion 311L and intermediate light-shield portion 313L. In addition, the first color filter 321 extends over the intermediate light-shield portion 313R, beyond the second light-shield portion 312. The second color filter 322 is disposed on the other of both sides of the second light-shield portion 312, that is, in the second color pixel PX2 on the right side in FIG. 7, covers the first light-shield portion 311R, and covers a part of the intermediate light-shield portion 313R. There is no gap between the first color filter 321 and the second color filter 322.

The columnar spacer SP is disposed at a position overlapping the first color filter 321 which extends up to above the intermediate light-shield portion 313R. The underlayer of the columnar spacer SP is a single color filter, and is the first color filter 321 in the example illustrated. Immediately below the columnar spacer SP, there are disposed the intermediate light-shield portion 313L, intermediate light-shield portion 313R, and second light-shield portion 312 which is located therebetween. Although not shown, like the above-described example, the first color filter 321 and second color filter 322 are covered with the overcoat layer. The columnar spacer SP is formed on the overcoat layer, and extends toward the array substrate.

For example, the first color filer 321 is a red color filter and the second color filter 322 is a blue color filter, and the first color pixel PX1 is a red pixel and the second color pixel PX2 is a blue pixel.

In each of the above-described examples, the columnar spacer SP is not disposed at all positions where the first light-shield portion 311 and second light-shield portion 312 intersect. At a position where the columnar spacer SP is not disposed, there is no need to provide the substantially octagonal crossing portion CR as shown in FIG. 5 or the gradually widening intermediate light-shield portion 313 as shown in FIG. 7, and the first light-shield portion 311 and second light-shield portion 312 intersect in a cross shape. As regards this point, an example will be described below.

Figure 8:
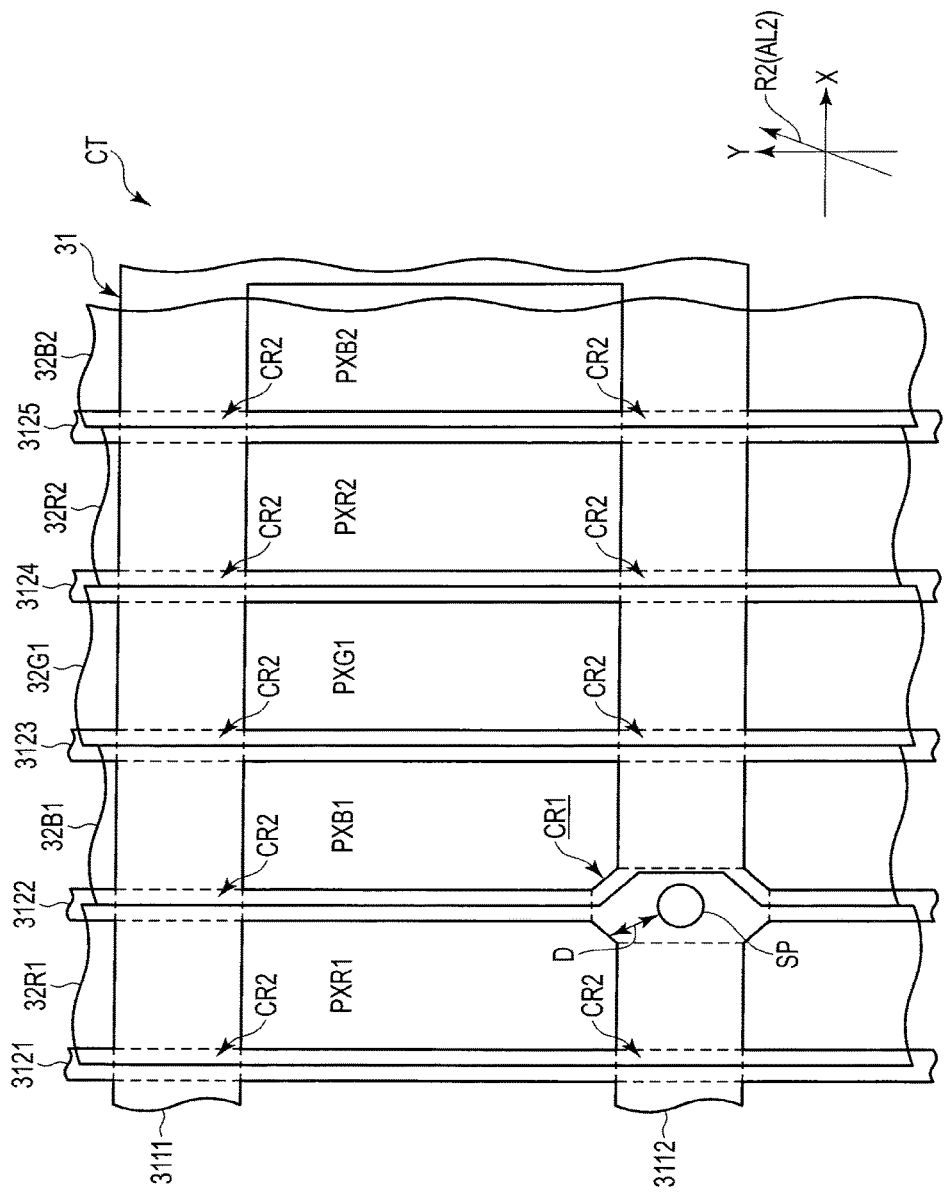
FIG. 8 is a plan view which schematically illustrates the structure of a counter-substrate, which is applicable to the liquid crystal display panel having the pixel structure shown in FIG. 3.

FIG. 8 is a plan view which schematically illustrates the structure of a counter-substrate CT, which is applicable to the liquid crystal display panel LPN having the pixel structure shown in FIG. 3.

In the example illustrated, a red pixel PXR1, a blue pixel PXB1, a green pixel PXG1, a red pixel PXR2, a blue pixel PXB2, . . . , are successively arranged from the left side to the right side in the first direction X. A black matrix 31 includes first light-shield portions 3111, 3112, . . . , which extend in the first direction X, and second light-shield portions 3121, 3122, 3123, 3124, 3125, . . . , which extend in the second direction Y. The black matrix 31 is formed in an orthogonal grating shape, and partitions the respective color pixels.

A first crossing portion CR1 having, for example, the above-described substantially octagonal shape is formed between the red pixel PXR1 and blue pixel PXB1 at a position where the first light-shield portion 3112 and second light-shield portion 3122 intersect. At a position where the first light-shield portion 3111 and second light-shield portion 3122 intersect or at other positions where the first light-shield portions and second light-shield portions intersect, a first crossing portion of a substantially octagonal shape is not formed, but second crossing portions CR2 of a substantially rectangular shape are formed. The second crossing portion CR2 is formed by the first light-shield portion and second light-shield portion intersecting at right angles in a cross shape. The area of the first crossing portion CR1 is larger than the area of the second crossing portion CR2.

Thus, in the example illustrated, the first light-shield portion 311 and second light-shield portion 312 of the black matrix 31 form a substantially rectangular aperture portion in each pixel, that is, an aperture portion having four corners. To be more specific, the first light-shield portion 311 and second light-shield portion 312 form a substantially rectangular aperture portion in the green pixel PXG1, red pixel PXR2, etc., and form a substantially pentagonal aperture portion, that is, an aperture portion having five corners, in the red pixel PXR1 and blue pixel PXB1. Specifically, in the red pixel PXR1 and blue pixel PXB1, the aperture portion has one corner shielded by the black matrix 31, although the aperture portion is normally substantially rectangular. In short, the four corners of the aperture portion corresponding to the green pixel PXG1, red pixel PXR2, etc. are defined by crossing portions having the same shape as the second crossing portion CR2, while one corner of the aperture portion corresponding to the red pixel PXR1 and blue pixel PXB1 is defined by a crossing portion having the same shape as the first crossing portion CR1. Thus, despite pixels corresponding to the same color, for example, the area of the aperture portion (pentagonal) of the red pixel PXR1 is smaller than the area of the aperture portion (rectangular) of the red pixel PXR2, and the area of the aperture portion (pentagonal) of the blue pixel PXB1 is smaller than the area of the aperture portion (rectangular) of the blue pixel PXB2.

When the area (aperture ratio) of the aperture portion of the pixel facing, on the four sides, the crossing portions having the same shape as the second crossing portion CR 2, for example, the red pixel PXR2, is 100%, the area of the aperture portion of the pixel of the same color, for example, the red pixel PXR1, which faces the crossing portion having the same shape as the first crossing portion CR1, is 93% to 97%. Specifically, the black matrix 31 shields 3% to 7% of the normal area of the aperture portion of the red pixel PXR1.

In addition, a distance D from the outer periphery of the columnar spacer SP to the oblique side of the first crossing portion CR1 is 10 μm to 20 μm in the liquid crystal display panel LPN having a resolution of 300 ppi.

A red color filter 32R1 is disposed in the red pixel PXR1. The red color filter 32R1 extends to the blue pixel PXB1 side on the first light-shield portion 3112. A blue color filter 32B1 is disposed in the blue pixel PXB1. A green color filter 32G1 is disposed in the green pixel PXG1. A red color filter 32R2 is disposed in the red pixel PXR2. A blue color filter 32B2 is disposed in the blue pixel PXB2.

The columnar spacer SP is disposed at the first crossing portion CR1 where the first light-shield portion 3112 and second light-shield portion 3122 intersect, and at the position overlapping the red color filter 32R1.

In the counter-substrate CT with the above-described structure, the alignment treatment direction R2 of the second alignment film AL2 is, for example, a direction inclined at several degrees to the second direction Y. This alignment treatment direction R2 is a direction from the columnar spacer SP toward the blue pixel PXB1.

Figure 9:
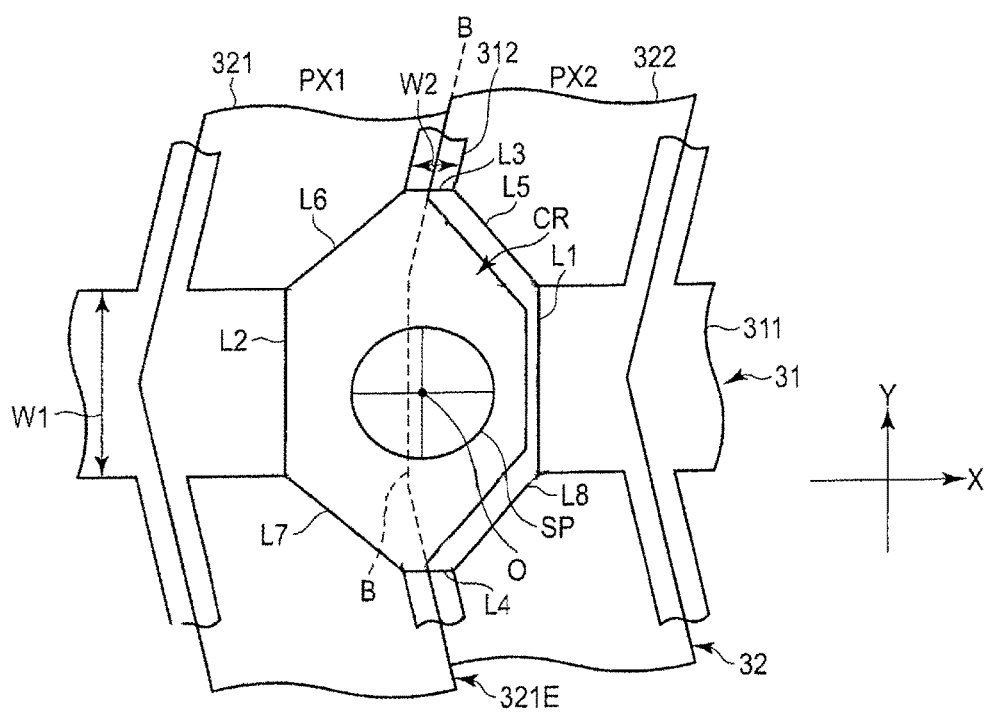
FIG. 9 is a schematic plan view for explaining a positional relationship between a black matrix, a color filter and a columnar spacer in a counter-substrate, which is applicable to the liquid crystal display panel having the pixel structure shown in FIG. 4.

FIG. 9 is a schematic plan view for explaining a positional relationship between the black matrix 31, color filter 32 and columnar spacer SP in the counter-substrate CT, which is applicable to the liquid crystal display panel LPN having the pixel structure shown in FIG. 4. The description is given of one aspect, which is similar to the example shown in FIG. 5.

The black matrix 31 includes a first light-shield portion 311 extending in the first direction X, and a second light-shield portion 312 extending in a direction crossing the first direction X. The first light-shield portion 311 is mainly opposed to the gate line and switching element shown in FIG. 4, which extend in the first direction X. The first light-shield portion 311 has a first width W1 in the second direction Y. The second light-shield portion 312 is bent and is mainly opposed to the source line shown in FIG. 4. The second light-shield portion 312 has a second width W2 in the first direction X. The first light-shield portion 311 is greater in width than the second light-shield portion 312, and the first width W1 is greater than the second width W2.

In the example illustrated, the first light-shield portion 311 and second light-shield portion 312 form a crossing portion CR of a substantially octagonal shape. Specifically, the first light-shield portion 311 and second light-shield portion 312 extend, with substantially uniform respective widths, in mutually crossing directions, but have gradually increasing widths in the vicinity of the crossing portion CR.

Incidentally, the first light-shield portion 311 and second light-shield portion 312 are formed integral or continuous in the same plane. Thus, the outer shape of the crossing portion CR is not visually viewed as the octagonal shape as shown in FIG. 9. The outer shape of the crossing portion CR is defined by terminal end portions (i.e. sides extending in the second direction Y with the first width W1) L1 and L2 at which the first light-shield portion 311 keeps the first width W1, terminal end portions (i.e. sides extending in the first direction X with the second width W2) L3 and L4 at which the second light-shield portion 312 keeps the second width W2, and oblique sides L5 to L8 which connect these terminal end portions. The oblique sides L5 to L8 have straight shapes extending in directions different from the first direction X and second direction Y. In the meantime, the respective terminal end portions may be connected with curved lines. The curved lines in this case are recessed toward the inside of the crossing portion CR.

The color filter 32 includes a first color filter 321 which is disposed on the left side in FIG. 9 and a second color filter 322 which is disposed on the right side in FIG. 9. The first color filter 321 extends over the first light-shield portion 311, and is disposed in the first color pixels PX1 which neighbor in the second direction Y, with the first light-shield portion 311 interposed. The second color filter 322 is a color filter of a color different from the color of the first color filter 321, extends over the first light-shield portion 311, and is disposed in the second color pixels PX2 which neighbor in the second direction Y, with the first light-shield portion 311 interposed.

In this case, if a pixel boundary B between the first color pixel PX1 and second color pixel PX2 is provided on the second light-shield portion 312 in accordance with the shape of the source line S shown in FIG. 4, an edge 321E of the first color filter 321 extends along the pixel boundary B on the second light-shield portion 312, and extends on the second color pixel PX2 side of the pixel boundary B (i.e. toward the side L1 of the crossing portion CR) in the crossing portion CR. Thus, the most part of the color filter, which overlaps the crossing portion CR, is the first color filter 321.

The columnar spacer SP is disposed at a position overlapping the crossing portion CR. The underlayer of the columnar spacer SP is a single color filter, and is the first color filter 321 in the example illustrated. In this example, the center O of the columnar spacer SP is offset from the pixel boundary B toward the second color pixel PX2. In this case, like the above-described example, the offset amount from the pixel boundary B to the center O of the columnar spacer SP is allowable within such a range that a part of the columnar spacer SP is located on the pixel boundary B. For example, the offset amount is allowable within a range of 1 μm to 5 μm. In the meantime, the center O of the columnar spacer SP may be located on the pixel boundary B. In addition, in the example illustrated, the columnar spacer SP has a circular outer shape in the X-Y plane, but it may have a polygonal shape or an elliptic shape.

The above-described first color filter 321 and second color filter 322 are ones selected from a red color filter, a green color filter and a blue color filter, and the first color pixel PX1 and second color pixel PX2 are ones selected from a red pixel, a green pixel and a blue pixel. For example, the first color filer 321 is a red color filter and the second color filter 322 is a blue color filter, and the first color pixel PX1 is a red pixel and the second color pixel PX2 is a blue pixel.

The cross section including the columnar spacer SP of the counter-substrate CT shown in FIG. 9 is substantially the same as in the example shown in FIG. 6, so a description thereof is omitted here.

Although another aspect as in the example shown in FIG. 7 may be described, the description is omitted here.

Figure 10:
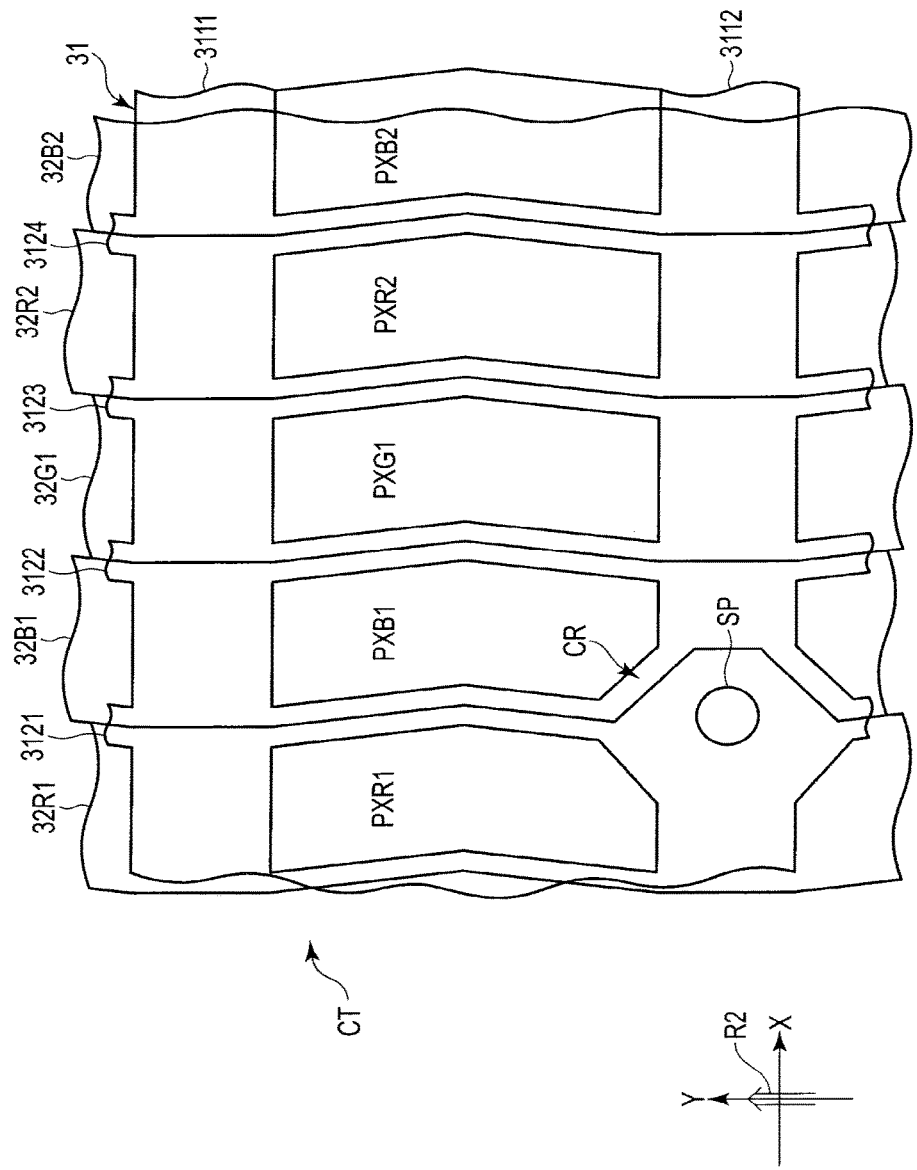
FIG. 10 is a plan view which schematically illustrates the structure of a counter-substrate, which is applicable to the liquid crystal display panel having the pixel structure shown in FIG. 4.

FIG. 10 is a plan view which schematically illustrates the structure of a counter-substrate CT, which is applicable to the liquid crystal display panel LPN having the pixel structure shown in FIG. 4.

In the example illustrated, a red pixel PXR1, a blue pixel PXB1, a green pixel PXG1, a red pixel PXR2, a blue pixel PXB2, . . . , are successively arranged from the left side to the right side in the first direction X. A black matrix 31 includes first light-shield portions 3111, 3112, . . . , which extend in the first direction X, and second light-shield portions 3121, 3122, 3123, 3124, . . . , which extend in the second direction Y. The black matrix 31 is formed in a non-orthogonal grating shape, and partitions the respective color pixels.

A crossing portion CR having, for example, the above-described substantially octagonal shape is formed between the red pixel PXR1 and blue pixel PXB1 at a position where the first light-shield portion 3112 and second light-shield portion 3121 intersect. At a position where the first light-shield portion 3111 and second light-shield portion 3122 intersect or at other positions where the first light-shield portions and second light-shield portions intersect, a crossing portion of a substantially octagonal shape is not formed, but crossing portions of a substantially cross shape are formed.

Thus, in the example illustrated, the first light-shield portion 311 and second light-shield portion 312 of the black matrix 31 form aperture portions with V-shaped bent shapes in the respective pixels. In the red pixel PXR1 and blue pixel PXB1, the aperture portion has one corner shielded by the black matrix 31, although the aperture portion normally has a V-shaped bent shape. Thus, despite pixels having the same color, for example, the area of the aperture portion of the red pixel PXR1 is smaller than the area of the aperture portion of the red pixel PXR2, and the area of the aperture portion of the blue pixel PXB1 is smaller than the area of the aperture portion of the blue pixel PXB2.

A red color filter 32R1 is disposed in the red pixel PXR1. The red color filter 32R1 extends to the blue pixel PXB1 side on the first light-shield portion 3112. A blue color filter 32B1 is disposed in the blue pixel PXB1. A green color filter 32G1 is disposed in the green pixel PXG1. A red color filter 32R2 is disposed in the red pixel PXR2. A blue color filter 32B2 is disposed in the blue pixel PXB2.

The columnar spacer SP is disposed at a position where the first light-shield portion 3112 and second light-shield portion 3121 intersect, where the columnar spacer SP overlaps the red color filter 32R1.

In the counter-substrate CT with the above-described structure, the alignment treatment direction R2 of the second alignment film AL2 is, for example, a direction parallel to the second direction Y. This alignment treatment direction R2 is a direction from the columnar spacer SP toward the blue pixel PXB1.

In the above-described embodiment, the columnar spacer SP is formed in a manner to overlap the black matrix 31, so as not to affect the display in the aperture portion. When the second alignment film AL2, which covers the columnar spacer SP, is subjected to alignment treatment such as rubbing treatment, there is a case in which the columnar spacer SP becomes an obstacle, and there occurs an area where proper alignment treatment fails to be performed ("defective alignment treatment area"). Such a defective alignment treatment area extends from the position of the columnar spacer SP, as a starting point, to the downstream side of the alignment treatment direction R2. In particular, in the above-described FFS mode, if a normally black mode, in which black is displayed in the state in which no voltage is applied to the liquid crystal layer LQ, is to be realized, there is concern that the alignment directions of liquid crystal molecules do not become uniform in the defective alignment treatment area and light leakage occurs. In addition, when such a stress acts on the liquid crystal panel LPN as to press or distort the liquid crystal panel LPN, the columnar spacer SP may possibly be displaced due to a received load. At this time, there is concern that the alignment of liquid crystal molecules in the vicinity of the columnar spacer SP is disturbed and light leakage occurs. In any case, light leakage in the vicinity of the columnar spacer SP may lead to degradation in contrast ratio.

According to the present embodiment, the columnar spacer SP is disposed at a position where the first light-shield portion 311 and second light-shield portion 312 of the black matrix 31 intersect. In addition, the area of the black matrix 31, which is located immediately below the columnar spacer SP (i.e. the area of the substantially octagonal crossing portion CR, or the area including the intermediate light-shield portion 313), is larger than the area where the columnar spacer SP is not disposed (i.e. the area of the substantially cross-shaped black matrix 31 at which the first light-shield portion 311 and second light-shield portion 312 intersect).

Thus, even if a defective alignment treatment area forms with a starting point at the columnar spacer SP, the defective alignment treatment area overlaps the black matrix 31 and therefore light leakage can be suppressed. In addition, even if a displacement of the columnar spacer SP occurs, light leakage can be suppressed since the peripheral area of the columnar spacer SP is shield by the black matrix over a wide area. Therefore, degradation in contrast ratio can be suppressed, and degradation in display quality can be suppressed.

In addition, in the present embodiment, the color filter 32, which is present between the columnar spacer SP and the black matrix 31, is a single layer. Thus, the columnar spacer SP is not affected by a stepped portion which may occur due to abutment between the edges of neighboring color filters, and the columnar spacer SP can be formed with a stable shape on a planar surface. Therefore, a variance in height of columnar spacers SP can be reduced. Thereby, a uniform cell gap can be created between the array substrate AR and the counter-substrate CT. Moreover, all columnar spacers SP can receive a substantially uniform load, and it is possible to suppress the occurrence of bubbles due to quick contraction of the liquid crystal material when a shock is applied in a low-temperature state.

Besides, in the present embodiment, the columnar spacer SP is disposed between the red pixel PXR1 and blue pixel PXB1. Of the three primary colors of red, green and blue, the color with a lowest luminous efficiency is blue and the color with a highest luminous efficiency is green. Specifically, the columnar spacer SP is disposed between the pixels which display two less conspicuous colors. In addition, the alignment treatment direction R2 of the second alignment film AL2 is a direction from the columnar spacer SP toward the blue pixel PXB1. Thus, even if the defective alignment treatment area, which forms from the columnar spacer SP as a starting point, extends to the aperture portion of the blue pixel PXB1, the effect on the display can be reduced.

In addition, in the present embodiment, in the black matrix 31, the crossing portion, which is located immediately below the columnar spacer SP, shields 3% to 7% of the area of the normal aperture portion of the pixel. The lower limit of 3% is based on the area of the crossing portion that is necessary for suppressing the above-described light leakage. The upper limit of 7% is an upper limit value at which a decrease in transmittance is not visually recognized when the area of the aperture portion of the pixel has decreased. In connection with this point, evaluations below were conducted, and the validity of this value was confirmed.

Figure 11:
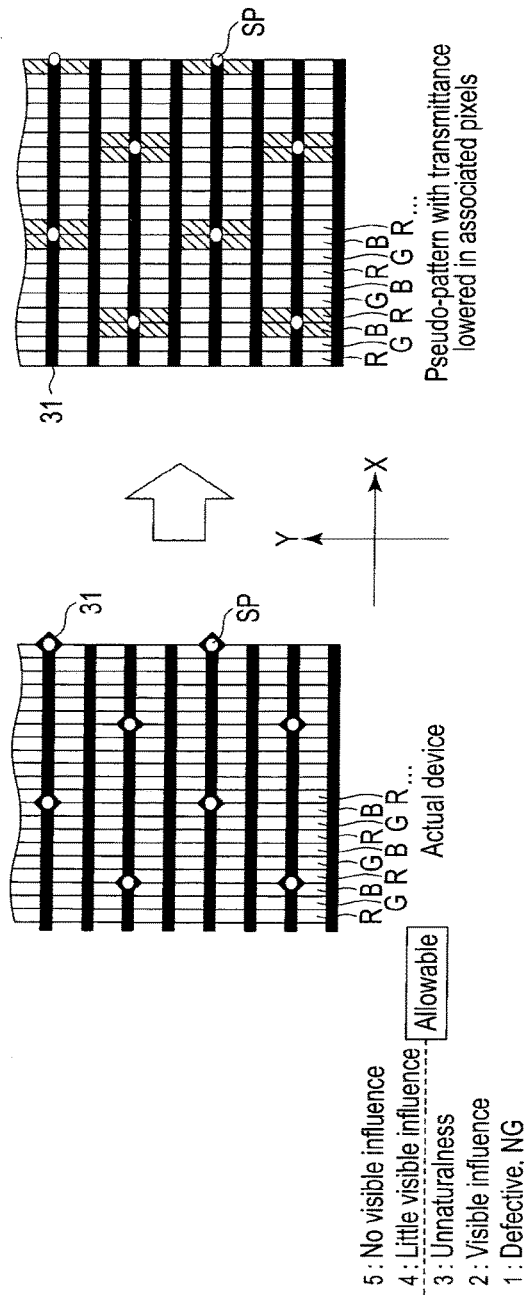
FIG. 11 is a view illustrating an evaluation method and an evaluation result of transmittance using a pseudo-pattern.

FIG. 11 is a view illustrating an evaluation method and an evaluation result of transmittance using a pseudo-pattern.

Specifically, an upper left part of FIG. 11 shows a plan view of an actual device, which has been described with reference to FIG. 3 and FIG. 8, and color pixels are successively arranged in the order of a red color R, a green color g, a blue color B, a red color R, . . . . In addition, the black matrix 31 in the vicinity of the columnar spacer SP is expanded. As regards the four pixels around the columnar spacer SP, the areas of their aperture portions are smaller than the areas of the other aperture portions.

An upper right part of FIG. 11 shows a pseudo-pattern which is capable of effecting display that is equivalent to the display of the actual device. The positions of the columnar spacers SP are the same as those in the actual device. As regards the four pixels around the columnar spacer SP, their transmittances are set to be lower than the transmittances of the other pixels. In this manner, by reducing the transmittances of the pixels, the decrease in area of the pixel aperture portions is reproduced.

As regards this pseudo-pattern, evaluations were conducted of the display state in which the transmittance of the four pixels (associated pixels) of the columnar spacer SP was set at −7% and the display state in which the transmittance of the four pixels of the columnar spacer SP was set at −10%, with respect to the case in which red R is displayed at a maximum gray level of 256 gray levels (R255), the case in which red R and blue B are displayed at the maximum gray level (RB255), the case in which red R, green G and blue B are displayed at the maximum gray level (W255), the case in which red R is displayed at an intermediate gray level (R127), and the case in which red R and blue B are displayed at the intermediate gray level (RB127).

The evaluation was conducted based on the following criteria: there is no visible influence due to a decrease in transmittance (5 points); there is little visible influence due to a decrease in transmittance (4 points); there is unnaturalness due to a decrease in transmittance (3 points); there is visible influence due to a decrease in transmittance (2 points); and there is conspicuous influence due to a decrease in transmittance, and NG (1 point).

A lower part of FIG. 11 shows evaluation results of the display states by seven test subjects A to G.

As regards (R255), (RB255), (R127) and (RB127), the influence due to the decrease in transmittance was visually recognized in some cases in the display state with the transmittance of −10%. However, in the display state with the transmittance of −7%, it was confirmed that little influence due to the decrease in transmittance was visually recognized. In these evaluations, too, it was confirmed that the black matrix 31 can shield 7% or less of the area of the normal aperture portion.

As has been described above, according to the present embodiment, there can be provided a liquid crystal display device which can suppress degradation in display quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid crystal display device comprising:
a first source line;
a second source line adjacent to the first source line;
a third source line adjacent to the second source line;
a gate line crossing the first source line, the second source line and the third source lines;
a first light-shielding portion of a black matrix;
a first color filter between the first source line and the second source line;
a second color filter between the second source line and the third source line, the second color filter being adjacent to the first color filter; and
a spacer, wherein
the first light-shielding portion extends in a first direction and overlaps the gate line,
the first color filter comprises a first edge and a second edge,
the first edge and the second edge are arranged in the first direction,
a first part of the first edge extends in a second direction which obliquely crosses the first direction,
a second part of the first edge extends in a third direction which obliquely crosses the first direction and is different from the second direction,
the first part and the second part are connected at a first bent portion,
the first source line overlaps the first part, the second part, and the first bent portion,
a third part of the second edge extends in the second direction,
a fourth part of the second edge extends in the third direction,
the second edge has a protrusion between the third part and the fourth part,
the third part and the fourth part overlap the second source line,
a tip of the protrusion is located between the second source line and the third source line and protrudes toward the third source line beyond the second source line,
the spacer is located at the protrusion,
the spacer, the first bent portion, and the protrusion overlap the first light-shielding portion, and
the spacer does not overlap the second color filter.

2. The liquid crystal display device according to claim 1, wherein
the first bent portion protrudes toward a first side of the first direction, and
the protrusion protrudes toward a second side of the first direction.

3. The liquid crystal display device according to claim 2, wherein
the third part and the protrusion are connected at a second bent portion, and
the fourth part and the protrusion are connected at a third bent portion,
and in a planar view,
the second bent portion and the third bent portion are located at the first side in the first direction,
the tip of the protrusion is located at the second side in the first direction, and
the second bent portion and the third bent portion are located between the first bent portion and the tip of the protrusion in the first direction.

4. The liquid crystal display device according to claim 3, further comprising:
a second light-shielding portion adjacent to the first light-shielding portion in a direction intersecting the second direction;
a third light-shielding portion overlapping the second source line and connected to the first light-shielding portion and the second light-shielding portion; and
a fifth part of the second edge of the first color filter extending in the third direction, wherein
the fifth part and the third part overlap the third light-shielding portion, and
the fifth part and the third part are connected at a fifth bent portion.

5. The liquid crystal display device according to claim 4, wherein
the fifth bent portion and the tip of the protrusion protrude toward the second side of the first direction.

6. The liquid crystal display device according to claim 5, wherein
the spacer overlaps the second source line.

7. The liquid crystal display device according to claim 6, wherein a width of the first color filter between the first bent portion and the tip of the protrusion is greater than a width of the first color filter between the first part and the third part in the first direction.

8. The liquid crystal display device according to claim 7, wherein the protrusion has a trapezoidal shape.

9. The liquid crystal display device according to claim 1, wherein a distance between the first bent portion and the spacer is longer than a distance between the spacer and the tip of the protrusion.

10. The liquid crystal display device according to claim 1, wherein
the second color filter comprises a third edge and a fourth edge,
the third edge and the fourth edge are arranged in the first direction,
the third edge is in contact with the first color filter,
the fourth edge includes a fourth bent portion on the first light-shielding portion, and
a width of the first color filter between the first bent portion and the tip of the protrusion is greater than a width of the second color filter between the fourth bent portion and the tip of the protrusion in the first direction.

* * * * *